(12) United States Patent
Franke

(10) Patent No.: US 9,551,764 B2
(45) Date of Patent: Jan. 24, 2017

(54) MAGNETIC FIELD MEASURING DEVICE

(71) Applicant: Micronas GmbH, Freiburg (DE)

(72) Inventor: Joerg Franke, Freiburg (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 15/177,818

(22) Filed: Jun. 9, 2016

(65) Prior Publication Data

US 2016/0363637 A1    Dec. 15, 2016

(30) Foreign Application Priority Data

Jun. 9, 2015 (DE) .................. 10 2015 007 190

(51) Int. Cl.
*H01L 43/04* (2006.01)
*G01R 33/07* (2006.01)
*H01L 43/06* (2006.01)

(52) U.S. Cl.
CPC .............. *G01R 33/07* (2013.01); *H01L 43/04* (2013.01); *H01L 43/065* (2013.01)

(58) Field of Classification Search
CPC ........ H01L 43/065; H01L 43/04; G01R 33/07; G01R 33/0052
See application file for complete search history.

(56) References Cited

U.S. PATENT DOCUMENTS

| 6,288,533 | B1 | 9/2001 | Haeberli et al. |
| 6,545,462 | B2 | 4/2003 | Schott et al. |
| 6,917,193 | B1 | 7/2005 | Howard et al. |
| 8,878,524 | B2 | 11/2014 | Heberle |
| 2005/0012176 | A1* | 1/2005 | Arnborg ............... H01L 27/0617 257/531 |
| 2007/0170533 | A1* | 7/2007 | Doogue ................. B82Y 25/00 257/422 |
| 2013/0154618 | A1 | 6/2013 | Heberle |
| 2014/0210461 | A1* | 7/2014 | Ausserlechner ..... G01R 33/075 324/251 |
| 2015/0137200 | A1* | 5/2015 | Johnson .................. G11C 11/18 257/295 |

(Continued)

FOREIGN PATENT DOCUMENTS

| DE | 199 46 935 A1 | 5/2001 |
| DE | 10 2014 011 245 B3 | 6/2015 |

(Continued)

*Primary Examiner* — Nathan W Ha
(74) *Attorney, Agent, or Firm* — Muncy, Geissler, Olds & Lowe, P.C.

(57) ABSTRACT

A magnetic field measuring device having a first semiconductor body having a surface formed in a first x-y plane, the first semiconductor body having on the surface two magnetic field sensors which are spaced apart and arranged along a first connecting line, and wherein the magnetic field sensors respectively measure a z-component of a magnetic field, and the x-direction and the y-direction and the z-direction are each formed orthogonally to each other. A first magnet is provided with a planar main extension surface formed in a second x-y plane and with a symmetry surface formed in an x-z plane, wherein the direction of magnetization extends substantially or exactly parallel to the main extension surface and substantially or exactly parallel to the plane of symmetry. The first semiconductor body and the first magnet are rigidly fixed to each other.

13 Claims, 2 Drawing Sheets

(56) References Cited

U.S. PATENT DOCUMENTS

2015/0323613 A1* 11/2015 Ausserlechner ........ H01L 27/22
              324/251
2015/0323614 A1* 11/2015 Ausserlechner ...... H01L 43/065
              324/251
2016/0033587 A1    2/2016 Kaufmann et al.

FOREIGN PATENT DOCUMENTS

| EP | 1 182 461 A2 | 2/2002 |
| EP | 0 916 074 B1 | 7/2003 |
| EP | 2 584 304 A1 | 4/2013 |
| EP | 2 607 857 A2 | 6/2013 |
| WO | WO 2009/005237 A2 | 1/2009 |
| WO | WO 2012/168635 A1 | 12/2012 |

* cited by examiner

MAGNETIC FIELD MEASURING DEVICE

This nonprovisional application claims priority under 35 U.S.C. §119(a) to German Patent Application No. 10 2015 007 190.4, which was filed in Germany on Jun. 9, 2015, and which is herein incorporated by reference.

BACKGROUND OF THE INVENTION

Field of the Invention

The invention relates to a magnetic field measuring device.

Description of the Background Art

From EP 2 607 857 A2, which corresponds to US 2013/0154618, which is incorporated herein by reference, an arrangement of a Hall sensor and a magnet is described, wherein by approximation of a ferromagnetic plate, a Hall voltage is generated in the Hall sensor.

Further, from EP 0 916 074 B1 (which corresponds to U.S. Pat. No. 6,288,533), EP 1 182 461 A2 (which corresponds to U.S. Pat. No. 6,545,462), WO 2009/005237 A2, EP 2 584 304 A1 (which corresponds to U.S. Pat. No. 8,878,524, which is incorporated herein by reference), DE 199 46 935 A1, U.S. Pat. No. 6,917,193 B1 and WO 2012/168635 A1, different approaches of designing a magnetic field measuring device known.

SUMMARY OF THE INVENTION

It is therefore an object of the invention to provide a device which further develops the prior art.

According to an exemplary embodiment of the invention, a magnetic field measuring device is provided, comprising a first semiconductor body having a surface formed in a first x-y plane, wherein the surface of the first semiconductor body has two magnetic field sensors which are spaced apart and arranged along a first connecting line, and wherein the magnetic field sensors respectively measure a z-component of a magnetic field, and the x-direction and the y-direction and the z-direction are each formed orthogonally to each other, and further a first magnet with a planar main extension surface, formed in a second x-y plane and with a plane of symmetry formed in a y-z plane, wherein the magnetization direction runs substantially or exactly parallel to the main extension surface and substantially or exactly parallel to the plane of symmetry, and the first semiconductor body and the first magnet are rigidly fixed to one another, and the first semiconductor body is arranged offset in translation to the first magnet in the x-y plane, and wherein an offset formed in z-direction between the first x-y plane and the second x-y plane is smaller than a thickness of the first magnet formed in the z-direction, and wherein both magnetic field sensors are spaced apart in the x-z plane and are arranged in the x-z plane along the extension of the north pole or along the extension of the south pole, and wherein in a z-component of the magnetic field of the first magnet asymmetrical to the symmetry plane, the magnetic field sensors form mutually different signals in order to measure the signals differentially.

The magnetic field measuring device can be designed to detect only a component of the magnetic field of the first magnet which is asymmetrically formed to the magnetic field sensors in the z-direction, and or a further magnet. For this purpose, the magnetic field of the first magnet must be modulated by a ferromagnetic body in such a way, that the magnetic field lines of the magnet are deflected at least partially from the rest position in the x-y plane, and deflected on both magnetic field sensors, variably in the z-direction.

It is preferable to effect the component of the magnetic field occurring in the z-direction by means of the plane of symmetry of the structure extending between the two magnetic field sensors in the z-direction, parallel to the connecting line of the magnetic field sensors, thereby effecting a ferromagnetic body spaced closer to one of the two magnetic field sensors. Furthermore, it is preferred that without the ferromagnetic body spaced in the z-direction, no or substantially no z-component of the magnetic field of the first magnet be formed. By adding the ferromagnetic body, the measuring device can be developed into a magnetic field measuring system. It is understood that the magnitude of the deflection of the magnetic field lines from the x-y plane through the ferromagnetic body is substantially greater at a lesser distance in the z-direction, than at a greater distance.

An advantage of the device according to the invention is that by means of two spaced magnetic field sensors and the particular location to the magnet, the magnetic field measuring device doubles the signal swing as soon as the body, which is asymmetrical to the plane of symmetry of the magnetic field measuring device, first passes closer to the one magnetic field sensor and then closer to the other magnetic field sensor. To this end, the difference between the two signals is calculated. Furthermore, an offset of constant magnetic fields can be suppressed as much as possible by the differential measurement.

In an embodiment, the first magnet has a rectangular design with two end faces designed as pole faces in the x-z plane, and two side faces formed in the y-z plane.

In an embodiment, the two magnetic field sensors are spaced apart along the x-direction, wherein the connecting line through the two magnetic field sensors is substantially or exactly orthogonally arranged to the plane of symmetry and the magnetization direction of the first magnet. In other words, the edge of the semiconductor body is arranged parallel or at least substantially parallel to the magnetization direction.

It is preferable to arrange the x-y plane of the magnetic field sensors on half the thickness of the first magnet, or in other words, to adjust the semiconductor body in such a way in the z-direction, that the x-y plane of the magnetic field sensors is positioned in the middle of the magnet.

It is advantageous that in the x-direction, the length of the first semiconductor body is substantially or exactly the same size or the same length as the extension of the first magnet.

It is preferable that the first semiconductor body and the first magnet each have a quadrangular shape in the x-y plane, wherein the first magnet and the first semiconductor body are spaced less than ten millimeters, preferably less than two millimeters, in the y-direction.

It is advantageous to design the two magnetic field sensors as Hall plates in or near the first x-y plane.

The Hall plates are hereby only sensitive to z-components of the magnetic field of the first magnet.

In an embodiment, the component of the magnetic field occurring in the z-direction is generated by means of a ferromagnetic body spaced in the z-direction, asymmetrically to the symmetry plane.

In an embodiment, a second semiconductor body, designed to be identical to the first semiconductor body, is provided. Preferably, the two semiconductor bodies are arranged such in the same x-y-plane, that the two connecting lines through the magnetic field sensors are substantially or exactly parallel to each other, and the two semiconductor bodies are arranged symmetrically with respect to the interposed first magnet, and each of the semiconductor bodies is arranged along one of the two pole faces of the first magnet.

In an embodiment, a second magnet is provided, wherein the first semiconductor body is disposed between the directly opposing, identical pole faces, either two north pole faces or two south pole faces, of the two magnets. One advantage is that in this way, the magnetic flux density is increased upon deflection of the field lines from the rest position by the two magnetic field sensors. It is preferable to design the main extension surfaces of the two magnets in the same x-y-plane.

It is advantageous to design an integrated circuit in the surface of the respective semiconductor body, wherein the integrated circuit is connected in an electrical operative connection with the respective magnetic field sensors.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
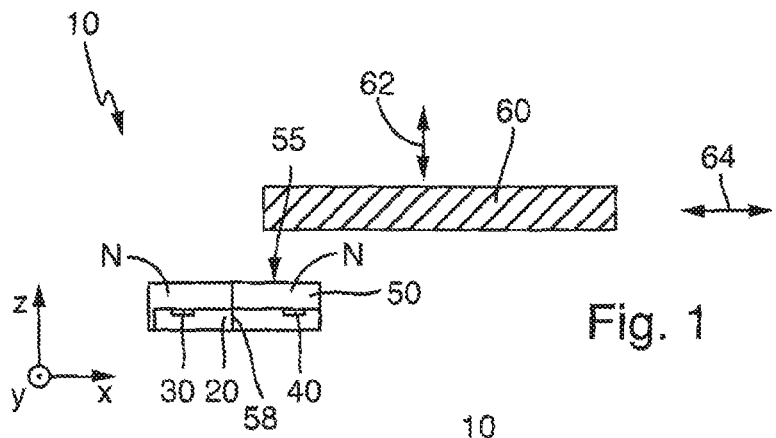
FIG. 1 is a cross-sectional view of an embodiment.

The illustration of FIG. 1 shows a cross-sectional view of a first inventive embodiment, a magnetic field measuring device 10 having a first semiconductor body 20. The first semiconductor body has a surface formed in a first x-y plane, wherein the first semiconductor body 20 comprises at the surface two magnetic field sensors 30 and 40, spaced apart and arranged along a first connecting line. The magnetic field sensors 30 and 40 are each formed as Hall plates and each measure only a z-component of a magnetic field of a first magnet 50. The two magnetic field sensors 30 and 40 here are formed near the first x-y plane. Furthermore, a plane of symmetry 58 is formed in the y-z plane. The plane of symmetry 58 substantially or exactly separates the first connecting line and the north pole face of the first magnet 50 in the respective center.

The first magnet 50 has a planar main extension surface 55 formed in a second x-y plane, wherein the direction of magnetization extends substantially or exactly parallel to the main extension surface 55 and to the plane of symmetry 58 of the first magnet 50. The first semiconductor body 20 and the first magnet 50 are rigidly fixed to each other. The first magnet 50 has a cuboidal design with two end faces constructed as pole faces in the x-z plane, and two side faces formed in the y-z plane.

In the present case, both magnetic field sensors 30 and 40 are spaced apart in the x-z plane and are positioned in the x-z plane along the extension of the north pole N or along the extension of the south pole S, so that with an occurring component of the magnetic field of the first magnet 50, which is asymmetrical to the symmetry surface 58, the magnetic field sensors 30 and 40 respectively form different signals, i.e., in the present case, Hall voltages, of different, differentially measurable values. For this purpose, the two magnetic field sensors 30 and 40 are connected in parallel with the same operating current direction and evaluated or connected in series with a differential amplifier, and driven at operating currents that are opposite to each other in the flow direction.

The two magnetic field sensors 30 and 40 are spaced from each other along the x-direction. The first connecting line through the two magnetic field sensors 30 and 40 is disposed substantially or exactly orthogonal to the plane of symmetry 58 of the first magnet 50. It was found that in the x-direction, it is advantageous to design the length of the first semiconductor body 20 substantially or exactly the same as the extension of the first magnet 50.

Preferably, the first semiconductor body 20 and the first magnet 50 is disposed on a not shown, metallic carrier, also called a lead frame.

The first semiconductor body 20 is arranged offset in translation in the x-y plane with respect to the first magnet 50. It is preferable that an offset formed in the z-direction between the first x-y plane and the second x-y plane is smaller than the thickness of the first magnet formed in the z-direction. Preferably, the x-y plane of the magnetic field sensors is disposed on half the thickness of the first magnet 50.

In the z-direction, a ferromagnetic body 60 spaced from the first magnet 50 is arranged asymmetrically relative to the plane of symmetry 58. The ferromagnetic body 60 is preferably of soft magnetic material and can be described as a target. The location of the target is adjustable as shown by the first arrow 62 in the z-direction and/or as shown by the second arrow 64 in the x-direction. It is understood that the magnetic field lines not shown for reasons of clarity are deflected in the direction of the z-axis due to the target. The strength of the deflection or of the change in flux through the two Hall plates as a function of the distance in the x-direction is shown in detail in FIG. 5. The strength of the deflection or of the change in flux through the two Hall plates as a function of distance in the z-direction is shown in detail in FIG. 6.

Figure 2:
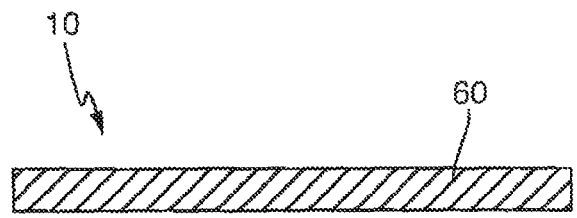
FIG. 2 is a cross-sectional view of the embodiment shown in FIG. 1, rotated by ninety degrees.

FIG. 2 shows a cross-sectional view of the embodiment shown in FIG. 1 rotated by ninety degrees. Below, only the differences from the illustration of FIG. 1 are explained. It is found that the first semiconductor body 20 and the first magnet 50 in the x-y plane each have a quadrangular shape. The first magnet 50 and the first semiconductor body 20 are spaced apart in the y-direction. It is preferable to design a distance in the y-direction of less than two millimeters.

Figure 3:
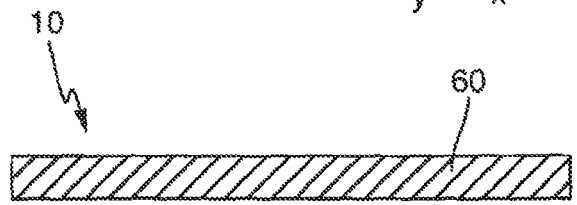
FIG. 3 is an embodiment with two semiconductor bodies.

The illustration of FIG. 3 shows a further embodiment with the first semiconductor body 20 and a second semiconductor body 70 spaced apart in the −y-direction. Below, only the differences from the illustration to the previous figures are explained. The first magnet 50 is arranged between the two semiconductor bodies 20 and 70. The second semiconductor body 70 is designed identical to the first semiconductor body 20. The two semiconductor bodies 20 and 70 are arranged in such a way in the same x-y plane, that the two connecting lines are substantially or exactly parallel to each other, and that the two semiconductor bodies 20 and 70 are arranged symmetrically with respect to the interposed first magnet, and each of the semiconductor bodies 20 and 70 is disposed along one of the two pole faces of the first magnet. It is desirable that the distance between the magnet and the magnetic field sensors in the y-direction is as uniform as possible.

Figure 4:
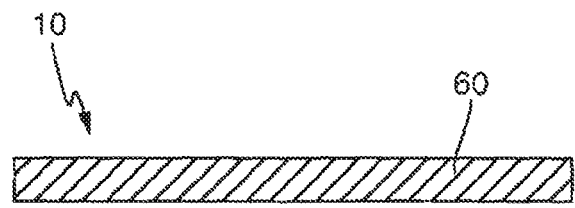
FIG. 4 is an embodiment with two magnets.

The illustration of FIG. 4 shows another embodiment with the first magnet 50 and a second magnet 80 spaced apart in the y-direction. Below, only the differences from the illustration to the preceding figures are explained. Between the two magnets 50 and 80, the first semiconductor body 20 is arranged between the directly opposing identical pole faces. The second magnet 80 is constructed identical to the first magnet 50. The two magnets 50 and 80 are arranged in the same x-y plane such that the pole faces of the magnets 50 and 80 are arranged parallel to each other. It is desirable that the distance between the two magnets 50 and 80 in the y-direction is as uniform as possible.

Figure 5:
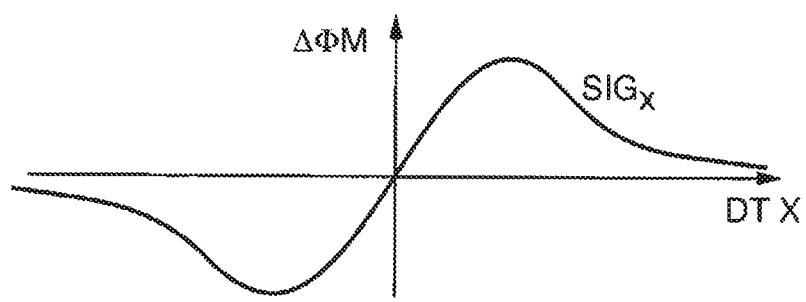
FIG. 5 illustrates a change in the magnetic flux density as a function of the x-distance of the ferromagnetic body.

The illustration of FIG. 5 shows a change in magnetic flux density $\Delta\Phi M$ as a function of the distance DT in the X-direction between the target and the first magnet 50 and/or the second magnet 80. It is found that the signal SIGx of the magnetic flux density $\Delta\Phi M$ is formed symmetrically about the X-axis with a change of the distance DT.

Figure 6:
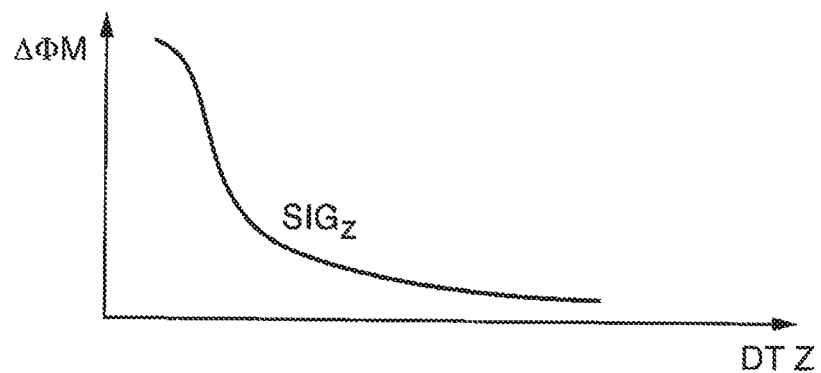
FIG. 6 illustrates a change in magnetic flux density as a function of the z-distance of the ferromagnetic body.

The illustration of FIG. 6 shows a change in the magnetic flux density $\Delta\Phi M$ as a function of the distance DT in the Z-direction between the target and the first magnet 50 and/or the second magnet 80. Below, only the differences from the illustration to FIG. 5 are explained. It is found that the flux density $\Delta\Phi M$ changes greatly at a small distance DT in the Z-direction, and at a great distance DT, it changes very little.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:
1. A magnetic field measuring device comprising:
a first semiconductor body having a surface formed in a first x-y plane, the surface of the first semiconductor body having two magnetic field sensors spaced apart and arranged along a first connecting line, and the magnetic field sensors respectively measure a z-component of a magnetic field, the x-direction and the y-direction and the z-direction each being orthogonally to one another; and
a first magnet with a planar main extension surface formed in a second x-y plane and with a plane of symmetry formed in a y-z plane,
wherein the magnetization direction runs substantially or exactly parallel to the main extension surface and substantially or exactly parallel to the plane of symmetry,
wherein the first semiconductor body and the first magnet are rigidly fixed to one another,
wherein the first semiconductor body is arranged offset with respect to the first magnet in the x-y plane,
wherein an offset formed in the z-direction between the first x-y plane and the second x-y plane is smaller than a thickness of the first magnet formed in the z-direction,
wherein both magnetic field sensors are spaced apart in the x-z plane and are arranged in the x-z plane along an extension of a north pole or along an extension of a south pole, and
wherein, in a z-component of the magnetic field of the first magnet asymmetrical to the plane of symmetry, the magnetic field sensors mutually form different signals in order to measure the signals differentially.

2. The magnetic field measuring device according to claim 1, wherein the first magnet has a cuboidal design with two end faces constructed as pole faces in the x-z plane and two side faces formed in the y-z plane.

3. The magnetic field measuring device according to claim 1, wherein the two magnetic field sensors are spaced apart along the x-direction and a connecting line is arranged through the two magnetic field sensors substantially or exactly perpendicular to the plane of symmetry of the first magnet.

4. The magnetic field measuring device according to claim 1, wherein the x-y plane of the magnetic field sensors is disposed on half the thickness of the first magnet.

5. The magnetic field measuring device according to claim 1, wherein in the x-direction, the length of the first semiconductor body is substantially or exactly the same size as the extension of the first magnet.

6. The magnetic field measuring device according to claim 1, wherein the first semiconductor body and the first magnet each have a quadrangular shape in the x-y plane, and wherein the first magnet and the first semiconductor body are spaced less than two millimeters in the y-direction.

7. The magnetic field measuring device according to claim 1, wherein the two magnetic field sensors are constructed as Hall plates in or near the first x-y plane.

8. The magnetic field measuring device according to claim 1, wherein a second semiconductor body designed substantially identical to the first semiconductor body is provided, wherein said two semiconductor bodies are arranged in the same x-y plane such that the two connecting lines are substantially or exactly parallel to each other and the two semiconductor bodies are arranged symmetrically with respect to the interposed first magnet, and each of the semiconductor bodies is arranged along one of the two pole faces of the first magnet.

9. The magnetic field measuring device according to claim 1, wherein a second magnet is provided, and the first semiconductor body is arranged between the immediately opposed, identical pole faces of the two magnets.

10. The magnetic field measuring device according to claim 9, wherein the main extension surfaces of the two magnets are formed in the same x-y plane.

11. The magnetic field measuring device according to claim 1, wherein in the surface of the respective semiconductor body, an integrated circuit is formed and the integrated circuit is in electrical operative connection with the respective magnetic field sensors.

12. The magnetic field measuring device according to claim 1, wherein the component of the magnetic field occurring in the z-direction is effected via a ferromagnetic body spaced in the z-direction and asymmetrically with respect to the plane of symmetry.

13. The magnetic field measuring device according to claim 12, wherein without the ferromagnetic body spaced apart in the z-direction, no z-component of the magnetic field is present.

* * * * *